US008779959B1

(12) United States Patent
Chuang et al.

(10) Patent No.: US 8,779,959 B1
(45) Date of Patent: Jul. 15, 2014

(54) METHOD OF DYNAMIC ELEMENT MATCHING AND AN APPARATUS THEREOF

(71) Applicants: Wen-Hsien Chuang, Taichung (TW); Hsiang-Wei Liu, New Taipei (TW); Jen-Wei Tsai, Hsinchu (TW); Ting-Hao Wang, Keelung (TW)

(72) Inventors: Wen-Hsien Chuang, Taichung (TW); Hsiang-Wei Liu, New Taipei (TW); Jen-Wei Tsai, Hsinchu (TW); Ting-Hao Wang, Keelung (TW)

(73) Assignees: Global Unichip Corp., Hsinchu (TW); Taiwan Semiconductor Manufacturing Company Ltd., Hsinchu (TW)

( * ) Notice: Subject to any disclaimer, the term of this patent is extended or adjusted under 35 U.S.C. 154(b) by 0 days.

(21) Appl. No.: 13/906,351

(22) Filed: May 31, 2013

(30) Foreign Application Priority Data

Dec. 26, 2012 (TW) .............................. 101149982 A

(51) Int. Cl.
*H03M 1/66* (2006.01)
*H03M 1/00* (2006.01)
*H03M 1/74* (2006.01)
*H03L 7/081* (2006.01)
*G06F 1/10* (2006.01)

(52) U.S. Cl.
CPC ........ *H03M 1/66* (2013.01); *H03M 2201/4135* (2013.01); *H03M 1/00* (2013.01); *H03M 1/747* (2013.01); *H03L 7/0814* (2013.01); *G06F 1/10* (2013.01)
USPC .......................................... 341/144; 241/118

(58) Field of Classification Search
CPC ......... H03M 1/747; H03M 1/66; H03M 1/00; H03M 2201/4135; G06F 1/10; H03L 7/0814
USPC ........... 341/144, 118, 110, 153; 327/158, 415
See application file for complete search history.

(56) References Cited

U.S. PATENT DOCUMENTS 8,223,055 B2 * 7/2012 Hochschild ................... 341/144

* cited by examiner

*Primary Examiner* — Joseph Lauture
(74) *Attorney, Agent, or Firm* — Min-Lee Teng; Litron Patent & Trademark Office

(57) ABSTRACT

A method to reduce the integral non-linearity (INL) of a digital-to-analog converter (DAC) and a DAC implementing said method are disclosed. The method in this invention is a pseudo dynamic element matching (PDEM) method. Compared with a prior art, the method of this invention provides a better performance in glitch. Compared with another prior art, the method of this invention also guarantees that DEM will not fail even if the input digital code remains constant.

14 Claims, 12 Drawing Sheets

| 101 | 102 | 103 | 104 | 105 | 106 | 107 | 108 |
|---|---|---|---|---|---|---|---|
| 109 | 110 | 111 | 112 | 113 | 114 | 115 | 116 | output 1:

| input | 3 |
|---|---|
| starting point | 101 |
| output cells | 101 |
| | 102 |
| | 103 | output 2:

| input | 3 |
|---|---|
| starting point | 105 |
| output cells | 105 |
| | 106 |
| | 107 | output 3:

| input | 6 |
|---|---|
| starting point | 113 |
| output cells | 113 |
| | 114 |
| | 115 |
| | 116 |
| | 101 |
| | 102 |

Fig. 1

| input | 201 | 202 | 203 | 204 | 205 | 206 | 207 |
|---|---|---|---|---|---|---|---|
| 011 | 1 | 1 | 1 | 0 | 0 | 0 | 0 |
| 101 | 1 | 1 | 1 | 1 | 1 | 0 | 0 |
| 010 | 0 | 0 | 0 | 1 | 1 | 0 | 0 |

Fig. 2

METHOD OF DYNAMIC ELEMENT MATCHING AND AN APPARATUS THEREOF

CROSS REFERENCE TO RELATED APPLICATIONS

This application claims the benefit of priority of Taiwan Application No. 101149982, filed Dec. 26, 2012, which is incorporated by reference herein in their entirety.

BACKGROUND OF THE INVENTION

1. Field of the Invention

The invention relates in general to a digital-to-analog converter (DAC) and, in particular, to reduce the integral non-linearity (INL) of a DAC.

2. Background of the Invention

Generally, a digital-to-analog converter (DAC) encounters a plurality of non-idealities such as total harmonic distortion (THD), difference nonlinearity (DNL), integral nonlinearity (INL), and etc. To reduce the INL of a DAC, there are many methods proposed. One of the most popular methods is dynamic element matching (DEM).

Although the INL of a DAC is capable of being reduced with a DEM method, numerous problems arise when reducing DEM to practice, such as the implementation of a randomized generator. One substitute method is a pseudo DEM. A pseudo DEM method utilizes a sequence of element arrangement to approach a DEM method.

Please refer to FIG. 1, which shows an embodiment of a first prior art, U.S. Pat. No. 7,679,539, in which a randomized generator is used for deciding the starting point of a plurality of 1-bit DACs. A decoder then chooses a first set in the plurality of 1-bit DACs as the output signal according to of the input digital signals and the starting point. In such a method, however, there may be a glitch in an outputting signal due to a lack of a common 1-bit DAC in two subsequent outputs. For example, a DAC 10 comprises fifteen 1-bit DACs, namely 101~115. In a first output, the 1-bit DACs 101~103 are selected. In a second output, the 1-bit DACs 105~107 are selected. In such an operation, large glitches are more prone to happen.

To avoid such a phenomenon, another PDEM is developed. Please refer to FIG. 2 which illustrates the method of another prior art, US 2011/0,279,292. In this prior art, if a first input signal is 011, the cells 201~203 are selected. If a second input signal is 101, which is larger than the first input 011, the cells 201~205 are selected. If a third input signal is 010, which is smaller than the second input 101, the cells 204 and 205 are selected. Hence, there is at least one common cell selected in two subsequent operations. However, in this prior art, it's not taught how to choose cells if the two subsequent inputs have an identical value. As a consequence, the PDEM may fail if the two subsequent inputs have an identical value.

What is needed is a method to reduce the glitch in DEM while preventing the PDEM from failure.

SUMMARY OF THE INVENTION

One purpose of this invention is to provide a pseudo dynamic element matching (PDEM) method to reduce the integral nonlinearity (INL) of a digital-to-analog converter (DAC).

In one embodiment, a DAC comprises a plurality of 1-bit DACs. Each of the plurality of 1-bit DACs has a roughly identical current for output. A current selector generates a priority sequence once for a while to determine the priority order of each of the plurality of 1-bit DACs to be selected as the output.

In one embodiment, a matching generating indicator randomly generates a value which represents a time interval before the next DEM operation.

In one embodiment, a matching generating indicator generates a flag in each period of a DAC. The flag is to decide whether the priority sequence of the current sources is to be changed.

With the brief description of drawings and detailed description of embodiment disclosed below, advantages, scope, and technical details of this invention are easy to be understood.

BRIEF DESCRIPTION OF DRAWINGS

The foregoing aspects and many of the accompanying advantages of this invention will become more readily appreciated as the same becomes better understood by reference to the following detailed description, when taken in conjunction with the accompanying drawings, wherein:

FIG. 1 illustrates a method of a first prior art;

FIG. 2 illustrates a method of a second prior art;

DETAILED DESCRIPTION OF EMBODIMENT

The detailed explanation of the present invention is described as following. The described preferred embodiments are presented for purposes of illustrations and description, and they are not intended to limit the scope of the present invention.

In this invention, a method for reducing the integral-non-linearity (INL) of a current steering digital-to-analog converter (DAC) is proposed. Compared with a first prior art illustrated in FIG. 1, a glitch phenomenon introduced by a dynamic element matching method is reduced with the method in this invention. Compared with a second prior art illustrated in FIG. 2, the problem that DEM may not work while the output value remains the same can be avoided.

Figure 3:
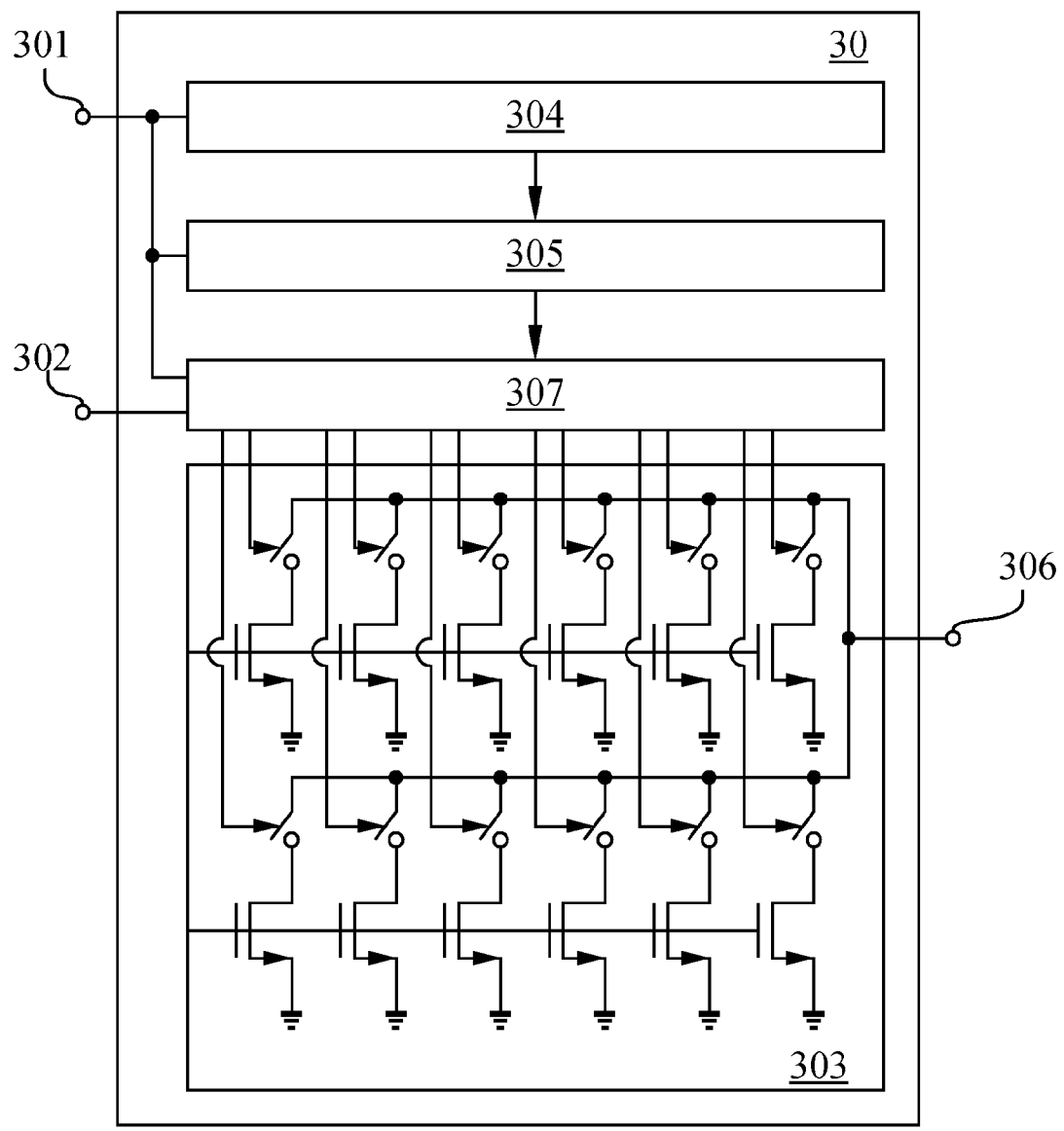
FIG. 3 illustrates a schematic of a circuit of this invention.

Please refer to FIG. 3 which illustrates a circuit schematic of one embodiment in this invention, a DAC 30 comprises a clock signal 301, an input port 302, an current array 303 comprising a plurality of current source, wherein each of the plurality current source has roughly identical output current, a matching flag generator 304, a current source selector 305, an output port 306, and a decoder 307. The clock signal 301 defines an operating period of the DAC 30. An input signal is received by the input port 302 every operating period. The matching flag generator 304 generates a flag for every couples of the operating period. When the flag is generated, the current source selector 305 determines a priority sequence of the plurality of current sources. The decoder 307 determines which set of the plurality of current source is chosen as the set of the output current source. The set of the output current source couples to the output port 306 to output current.

Figure 4:
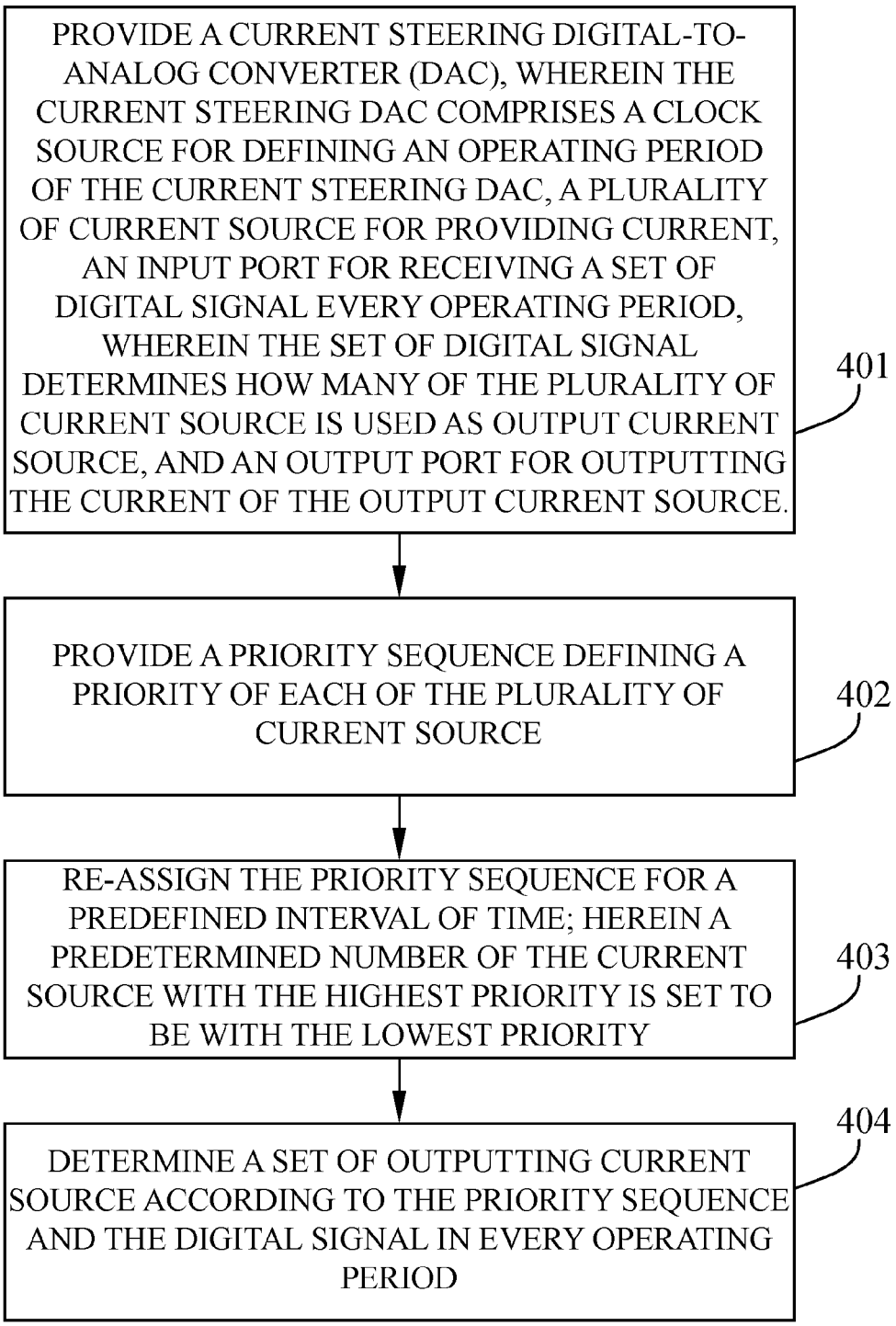
FIG. 4 illustrates a flow chart of this invention.

In one embodiment of this invention, please refer to FIG. 4 which is a flow chart of this invention. In step 401, a current steering digital-to-analog converter (DAC) is provided, wherein the current steering DAC comprises a clock source for defining an operating period of the current steering DAC, a plurality of current sources for providing current, an input port for receiving a set of digital signal every operating period, wherein the set of digital signal determines how many of the plurality of current source is used as output current source, and an output port for outputting the current of the output current source. In step 402, a priority sequence is then provided. The priority sequence defines a priority of each of the plurality of current source. In step 403, the priority sequence is re-assigned for a predefined interval of time; herein a predetermined number of the current source with the highest priority is set to be with the lowest priority, wherein the predetermined number can be a predefined constant. In step 404, a set of outputting current source is determined according to the priority sequence and the digital signal in every operating period. For example, if there is an input signal that corresponds to an output signal requiring ten current sources, the ten current sources with the highest priority are chosen as output current sources.

Figure 5:
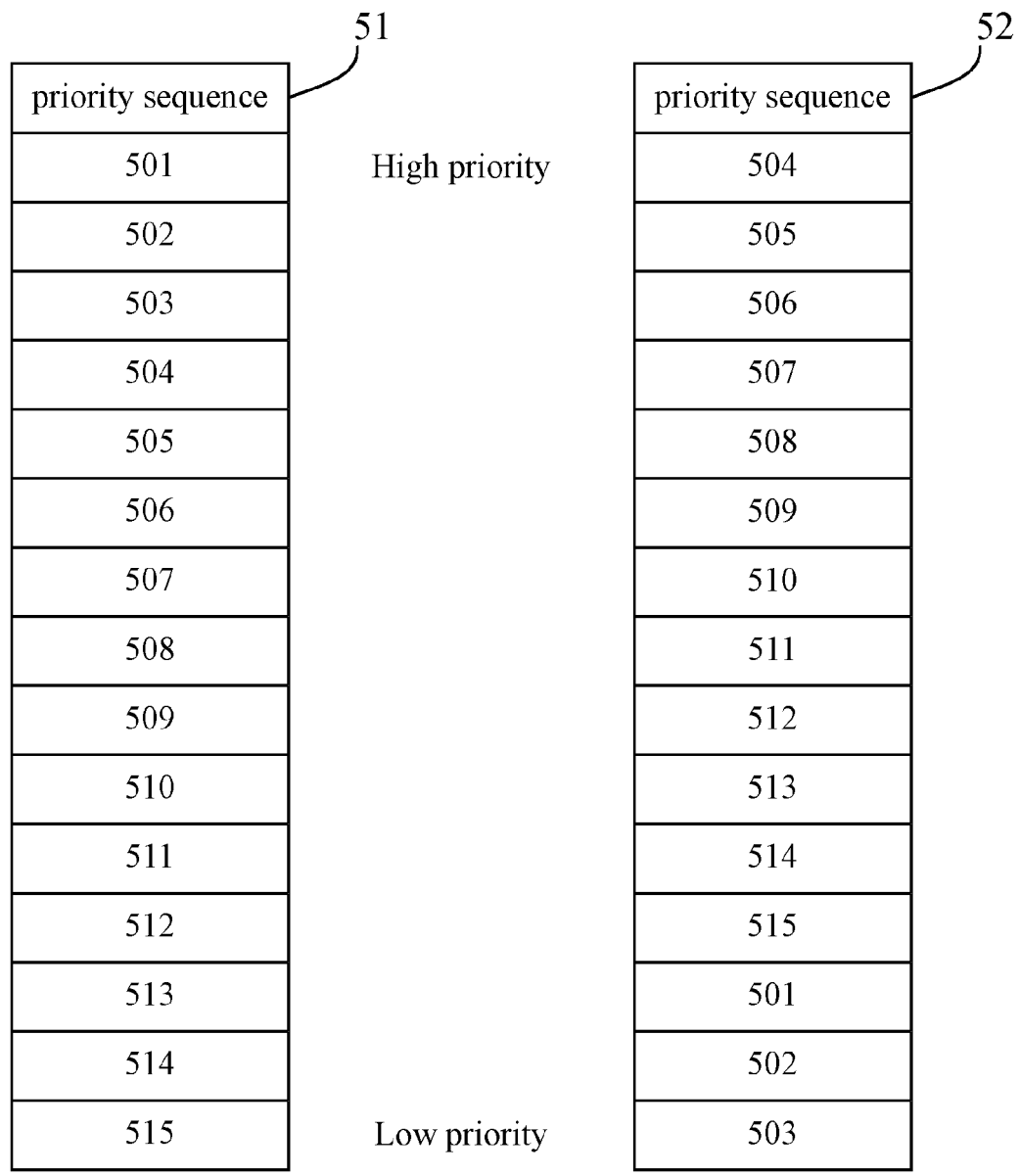
FIG. 5 illustrates one embodiment of this invention.

Referring to one operating method of the current source selector 305, please refer to FIG. 5, cells 501~515 represent fifteen current sources in the current source array 303, wherein the current of each of the fifteen current sources is roughly identical. The current source selector 305 generates a first priority sequence 51. In the first priority sequence 51, the cell 501 has the highest priority and the cell 515 has the lowest priority. If there is a first input signal corresponding to an output current which is a sum of four current sources, the cells 501, 502, 503, and 504 are chosen as output current sources. When the current source selector 305 generates a second priority sequence 52, if a predefined constant is three, the priorities of the three current sources with the highest priority in the first priority sequence 51, i.e., the cells 501~503, are set to be the lowest priority. In other words, in the second priority sequence 52, the cell 504 has the highest priority and the cell 503 has the lowest priority. If there is a second input signal corresponding to an output current which is a sum of seven current sources, the cells 504~510 are chosen as output current sources.

Figure 6A:
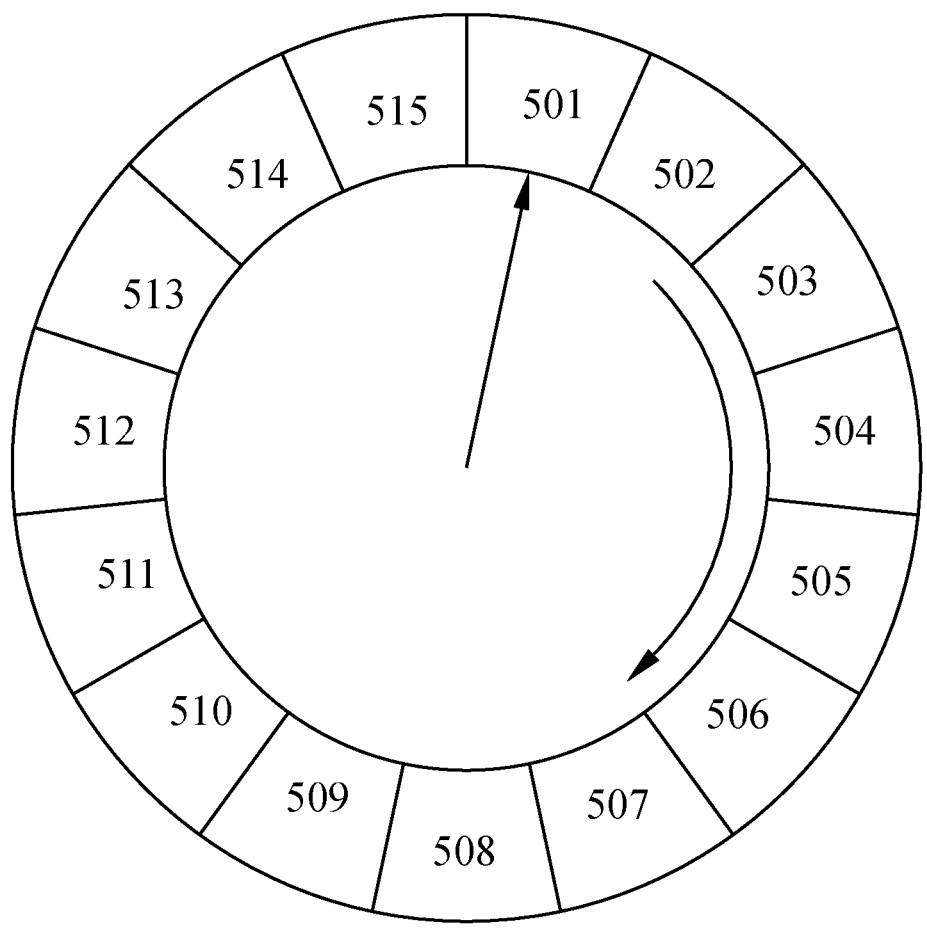
FIG. 6A~6D illustrate other embodiments of this invention.
Figure 6B:
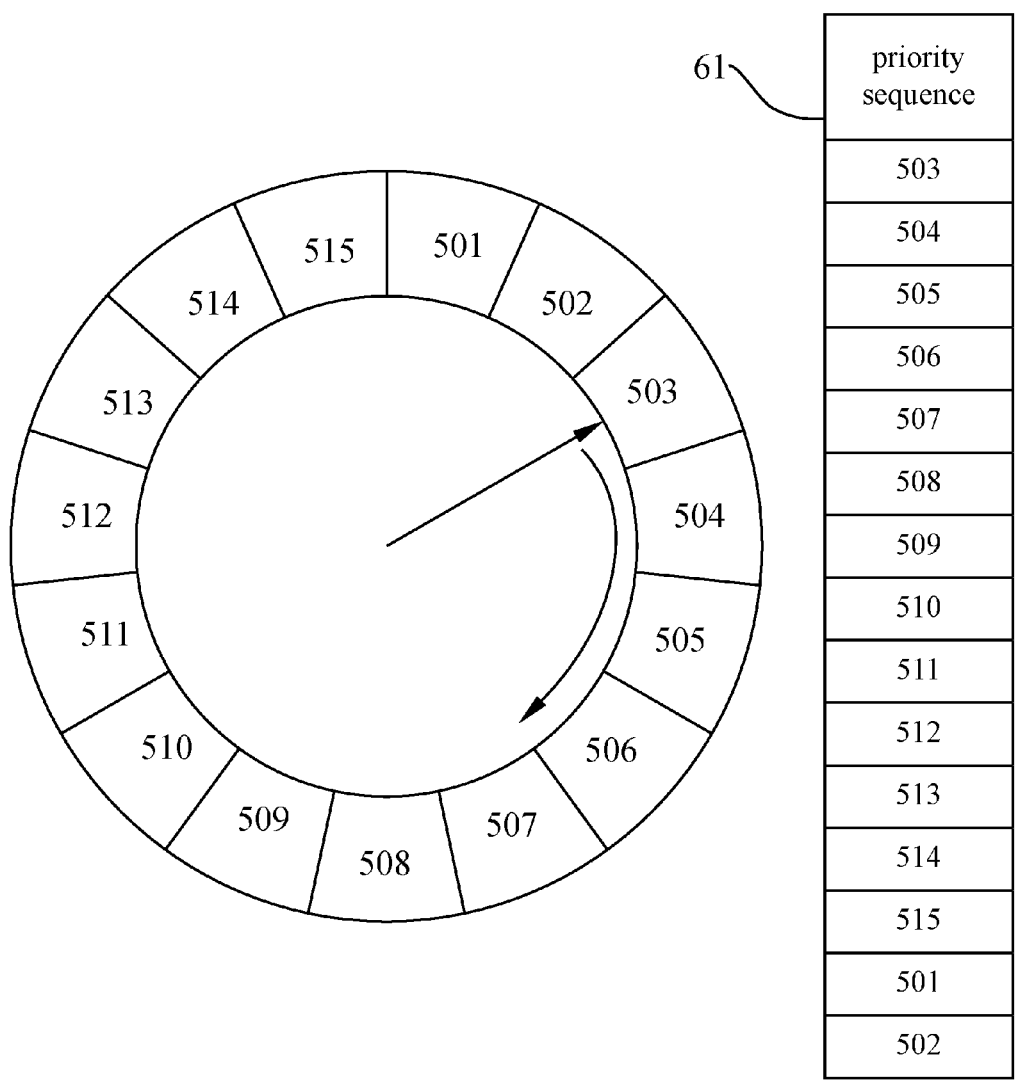

In another embodiment of this invention, please refer to FIG. 6A~6D which illustrates another realization of the current selector 305, the cells 501~515 are arranged in a circle, as FIG. 6A. The current source selector 305 determines a priority sequence by determining a starting point and a direction of selection. The starting point is a first cell which will be selected first. The direction of selection, clockwise or counter-clockwise, indicates a sequence of selection. As shown in FIG. 6B, if a first starting point is cell 503, and a first direction of selection is clockwise, a first priority sequence is as table 61. In the mean time, if there is an input digital signal that demands an output current equaling to a sum of seven current sources, the cells 503~509 are then chosen as output current sources.

Figure 6C:
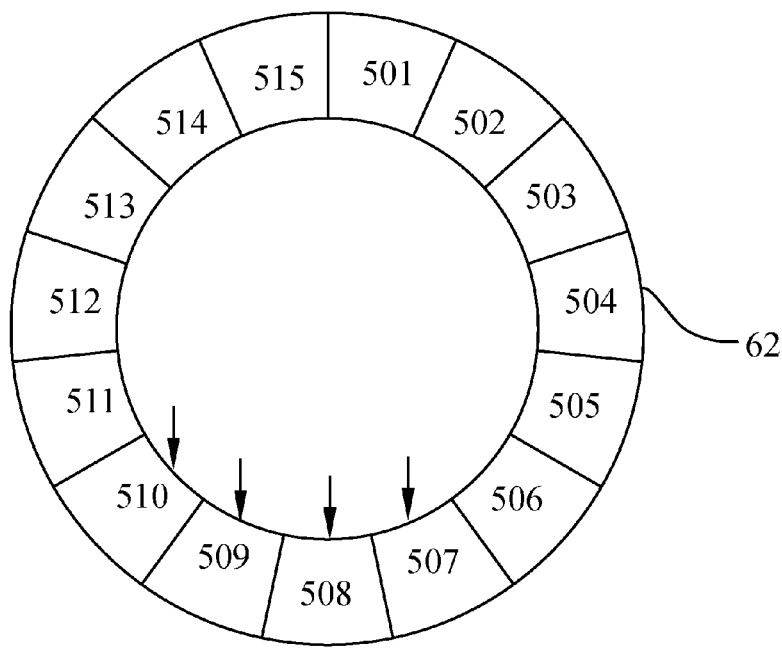
Figure 6C:
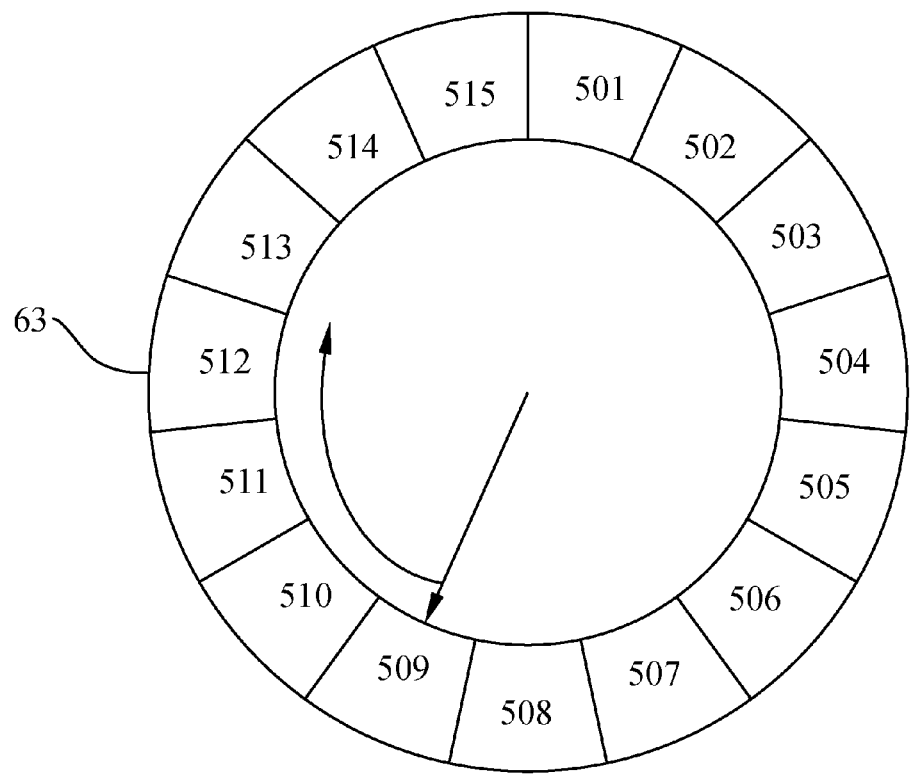

Please refer to FIG. 6C, when the current source selector 305 is to generate a second priority sequence, the current source selector 305 determines a new direction of selection first and then determines a new starting point according to the new direction of selection, an amount of variation, and a last set of selected current sources. As illustrated by the symbol 62, the last set of selected current sources consists of cells 507~510. If a new direction of selection and an amount of variation are respectively set to be clockwise and two, in a second priority sequence, cell 509 is a starting point regardless a previous direction of selection, as illustrated by the symbol 63.

Figure 6D:
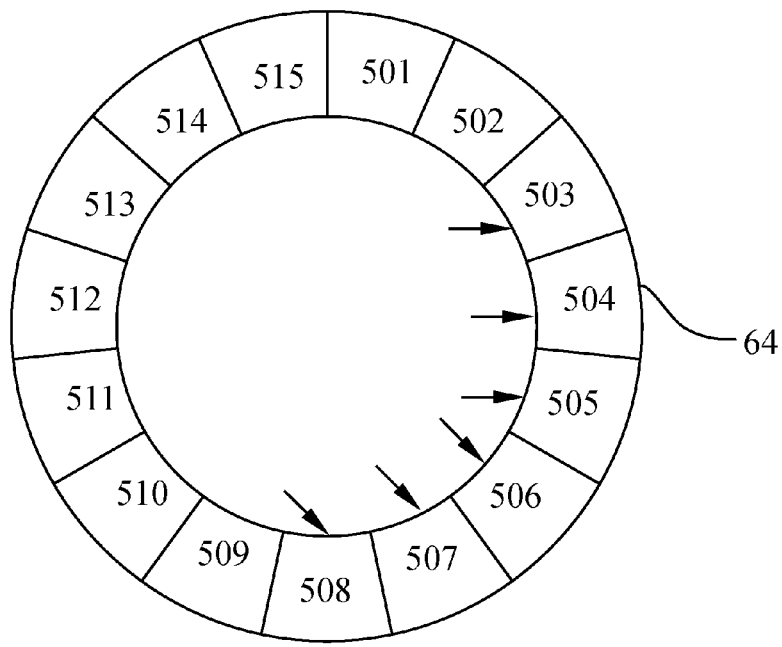
Figure 6D:
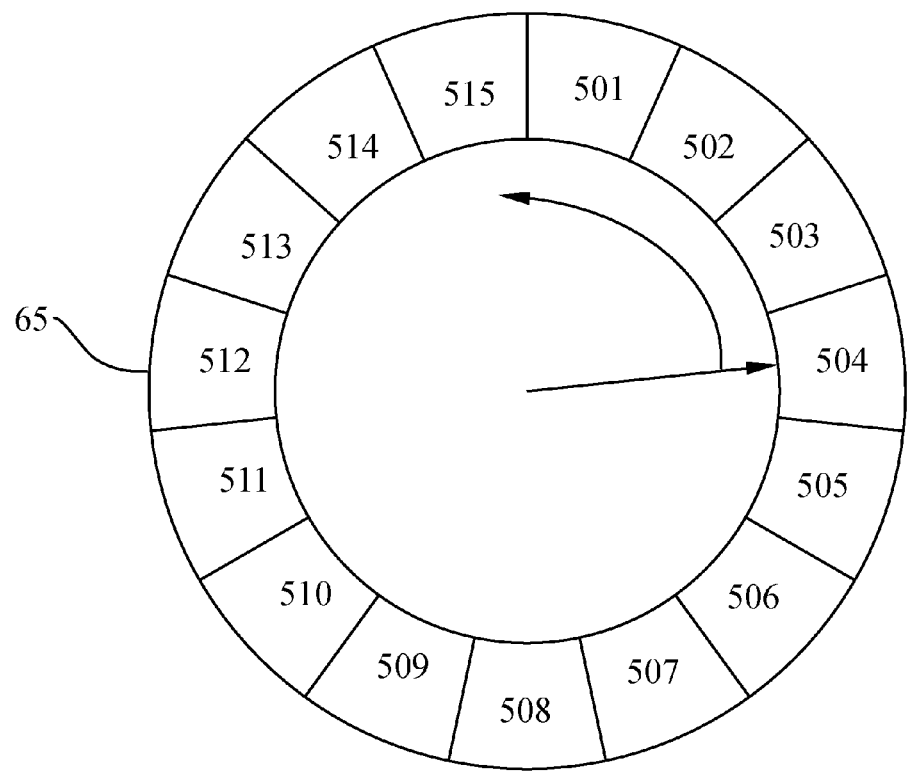

Please refer to FIG. 6D. As illustrated by the symbol 64, the last set of selected current sources consists of cells 503~508. If a new direction of selection and an amount of variation are respectively set to be counter-clockwise and four, in a second priority sequence, cell 504 is a starting point regardless a previous direction of selection, as the symbol 65.

In the paragraph discussing the realization of the current selector 305, the amount of variation is a predefined value or a value generated by a random generator once for a while.

Figure 7A:
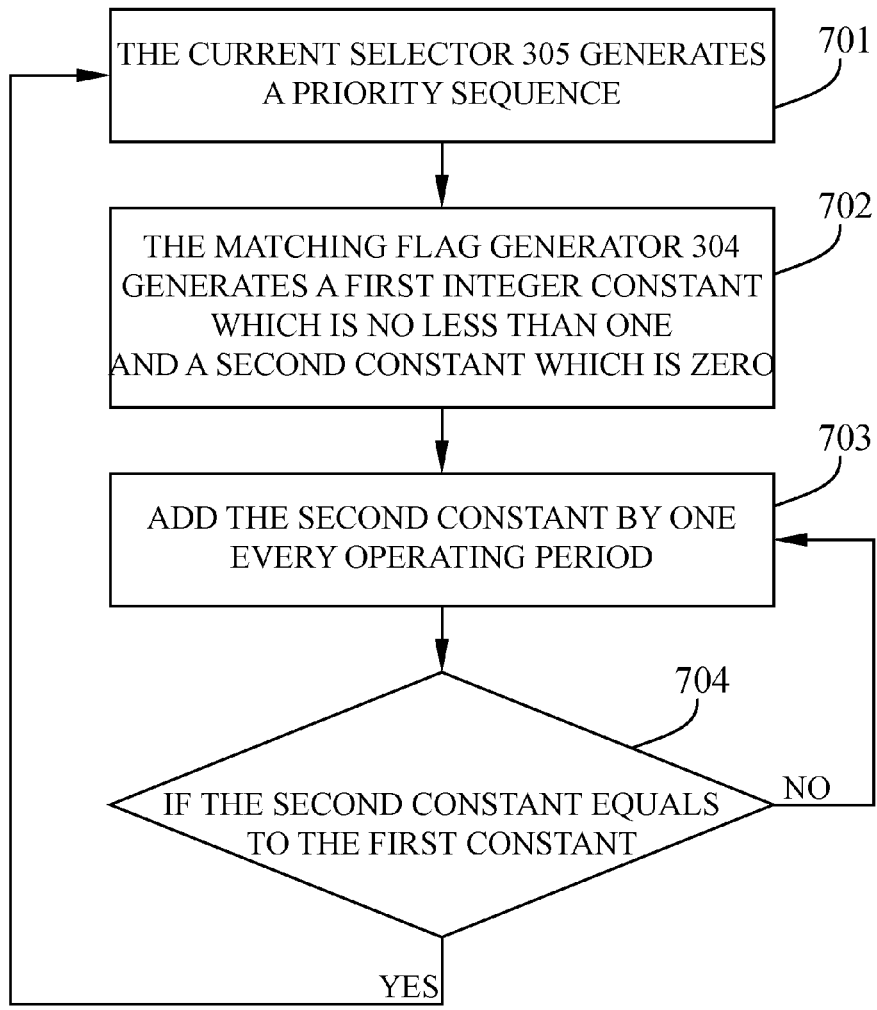
FIG. 7A~7B illustrates a method deciding a time interval between two dynamic element matching operations.

In one embodiment, please refer to FIG. 7A which illustrates a realization of the matching flag generator 304. In step 701, the current selector 305 generates a priority sequence. In step 702, the matching flag generator 304 generates a first integer constant which is no less than one and a second constant which is zero. In step 703, every operating period, the second constant is added by one. In step 704, it is checked if the second constant equals to the first integer constant. If the second constant is not equal to the first constant, the next step will be step 703. If the second constant equals to the first constant, the next step will be step 701. In other words, the matching flag generator 304 determines a time interval before a new priority sequence is to be generated.

Figure 7B:
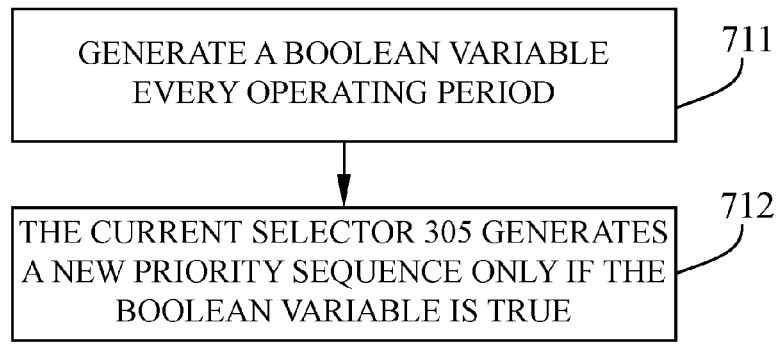

In another embodiment, please refer to FIG. 7B. In step 711, a Boolean variable is generated every operating period. In step 712, only if the Boolean variable is true, the current selector 305 generates a new priority sequence. Hence, the matching flag generator 304 determines whether the current selector 305 generates a new priority sequence every operating period.

In addition, the matching flag generator 304 is capable of storing a predefined value. In such a case, the dynamic element matching method is operated once for a constant interval.

In one embodiment, an input port of a DAC receives a four-bit digital signal and a current source array of the DAC consists of more than fifteen identical current sources.

Figure 8A:
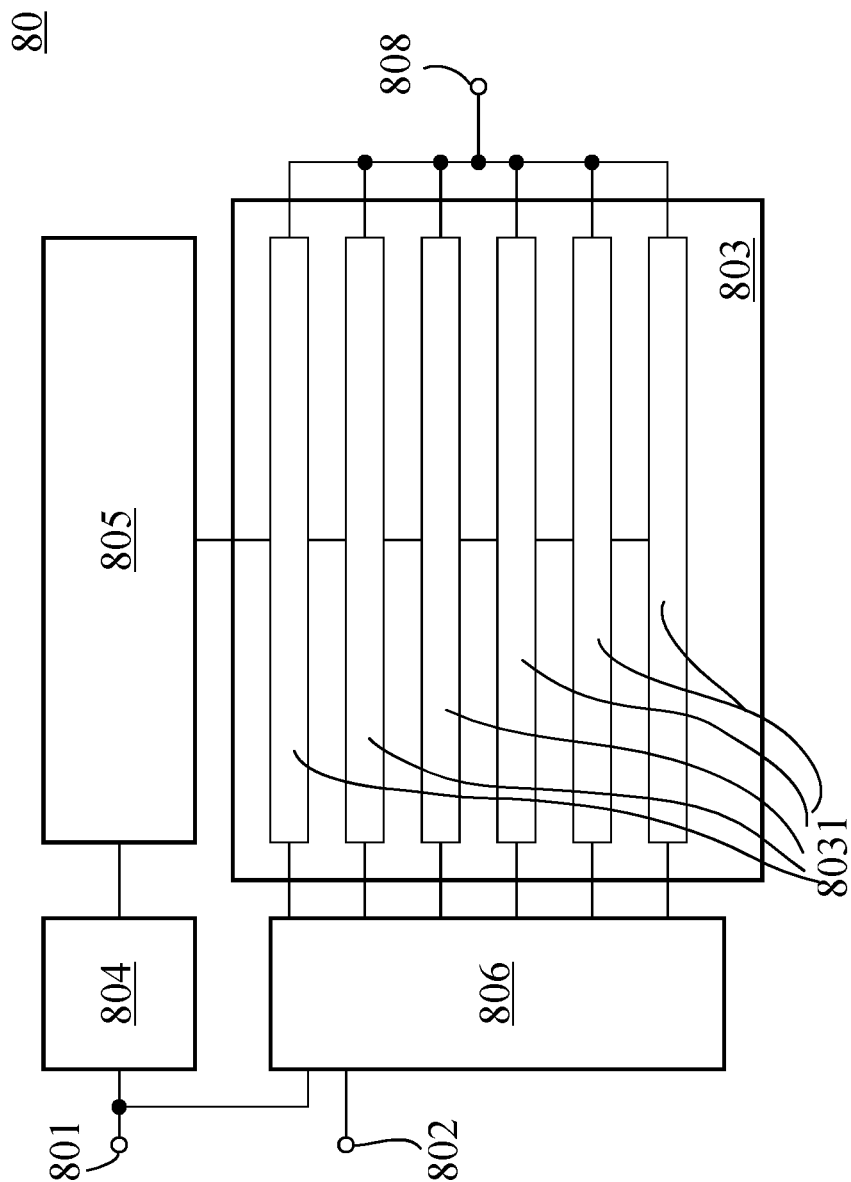
FIG. 8A~8B illustrates a schematic of a circuitry implementing this invention.
Figure 8B:
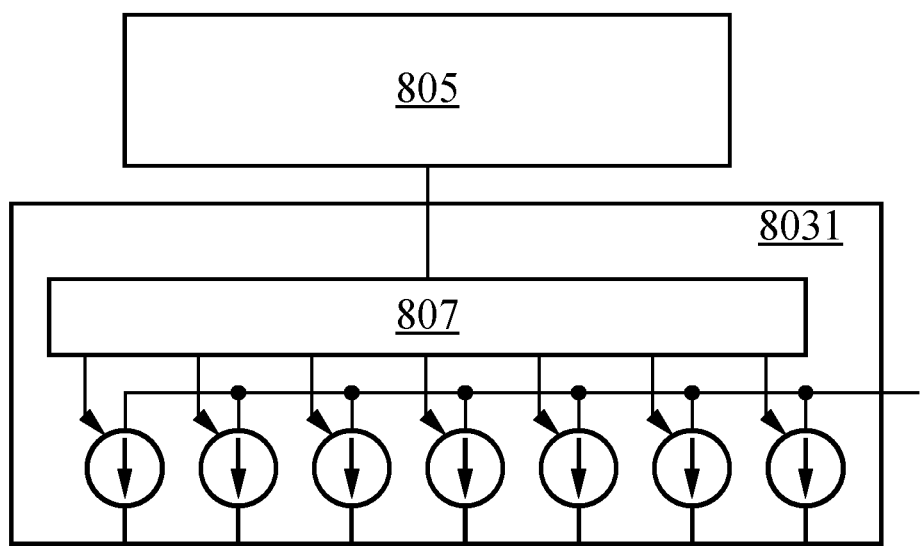

In one embodiment, please refer to FIGS. 8A and 8B which illustrate a circuitry structure of this invention. A DAC 80 comprises a clock signal 801 for defining an operating period of the DAC 80, an input port 802 for receiving a set of digital signal every operating period, a current source array 803 consisting of a plurality of roughly identical current source, a matching flag generator 804 for determining a time point for generating a priority sequence of the plurality of current source, a current selector 805 for generating the priority sequence, a row decoder 806 for determining whether a row of current sources is selected for output according to the input digital signal. Each row of current sources comprises a column encoder 807 for determining whether a current source is selected as an output current according to the input digital signal and the priority sequence every operating period. A current source is coupled to an output port 808 if the current source is selected by the row decoder 806 and the column encoder 807.

Figure 9:
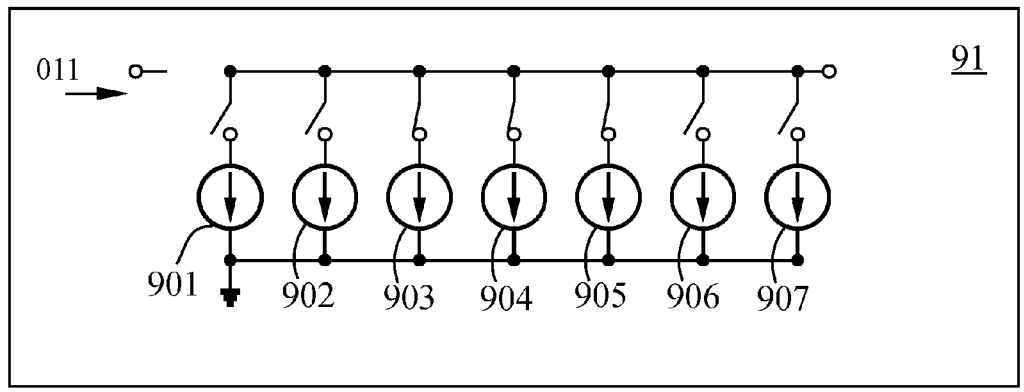
FIG. 9 illustrates an embodiment of this invention.
Figure 9:
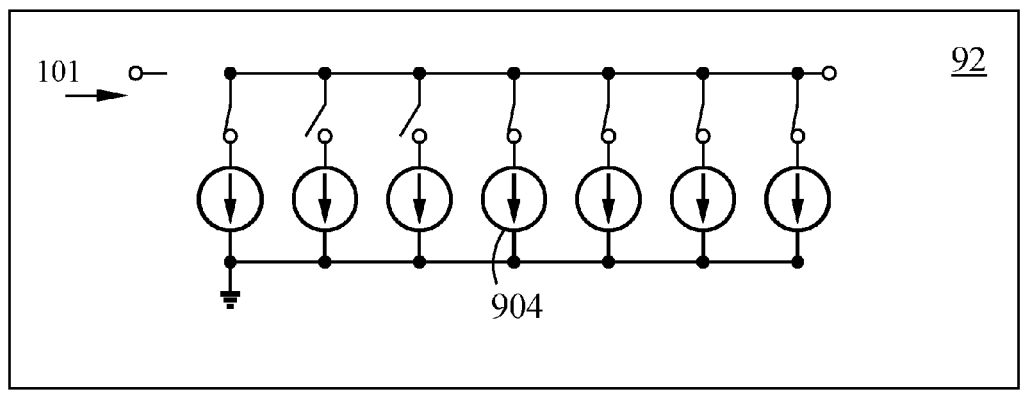
Figure 9:
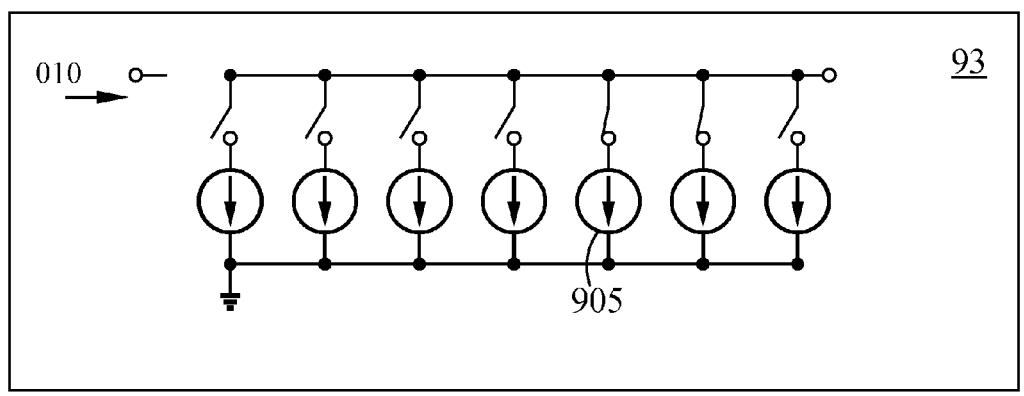

In one embodiment, please refer to FIG. 9. A DAC utilizing this invention comprises an input port for receiving a three-bit digital signal, an output port for outputting analog signal and seven current sources 901~907, wherein the current of each of the seven current source is roughly identical. The DAC operates the dynamic element matching method in this invention once an operating period, wherein an amount of variation is predefined as one. Hence, if the starting point in this operating period is the current source 905, the starting point in next operating period is the current source 906. If the starting point in this operating period is the current source 907, the starting point in next operating period is the current source 901. For example, in a first operating period, the starting point of the DAC is the current source 903, and an input digital signal 011 is received, so the current sources 903~905 are selected as outputting current sources, as shown in state 91. In a second operating period, the starting point of the DAC is set to be the current source 904 according to the dynamic element matching method, and an input digital signal 101 is received, so the current sources 901 and 904~907 are selected as outputting current sources, as shown in state 92. In a third operating period, the starting point of the DAC is set to be the current source 905 according to the dynamic element matching method, and an input digital signal 010 is received, so the current sources 905~906 are selected as outputting current sources, as shown in state 93.

The foregoing descriptions of specific embodiments of the present invention have been presented for purposes of illustrations and description. They are not intended to be exclusive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to particular use contemplated. It is intended that the scope of the invention be defined by the claims appended hereto and their equivalents.

What is claimed is:

1. A method for reducing integral nonlinearity (INL) of a digital-to-analog converter (DAC), wherein the DAC comprises a clock for defining a period of said DAC, an input port for receiving an input signal in each period, and N 1-bit DAC for outputting signal, wherein N is a positive integer, the method comprising the step of:
   A. providing a priority sequence of the N 1-bit DACs, wherein the priority sequence defines the priority of each of the N 1-bit DACs;
   B. determining a set among the N 1-bit DACs for outputting according to the priority sequence and the input signal in each period; and
   C. re-assigning the priority sequence after a first number of periods, wherein a second number of current sources with the highest priority is set to be with the lowest priority, and the second number is no less than one.

2. The method cited in claim 1, wherein the second number is one.
3. The method cited in claim 1, wherein the first number is an integer.
4. The method cited in claim 3, wherein the first number is one.
5. The method cited in claim 3, wherein the first number is a predefined positive integer.
6. The method cited in claim 3, wherein the first number is generated by a random generator.
7. A digital-to-analog converter (DAC), comprising:
   a clock signal for defining an operating period of the DAC;
   a first number of current sources for outputting current, wherein the current of each of the first number of current source is roughly identical;
   an input port for receiving an N-bit input signal, wherein the N-bit input signal determines a second number of the first number of current source for outputting current, wherein the second number is a positive integer;
   a current selector for generating a priority sequence in a third number of operating period, wherein the priority sequence defines a priority of each of the first number of current source to be selected for outputting current, wherein when the priority sequence is generated, a fourth number of current source with the highest priority is set to be with the lowest priority; and
   a decoder for selecting one or more of the first number of current sources for outputting current according to the N-bit input signal and the priority sequence in every operating period.

8. The DAC cited in claim 7, further comprising a matching flag generator for determining the third number.
9. The DAC cited in claim 7, further comprises a matching flag generator for determining whether the priority sequence is modified in each operating period.
10. The DAC cited in claim 7, wherein the third number is predefined.
11. The DAC cited in claim 7, wherein the third number is a positive integer no less than one.
12. The DAC cited in claim 7, wherein the third number is one.
13. The DAC cited in claim 7, wherein the fourth number is one.
14. The DAC cited in claim 7, wherein the first number is larger than $2^N-1$.

* * * * *